United States Patent
Lee et al.

(10) Patent No.: US 12,255,244 B2
(45) Date of Patent: *Mar. 18, 2025

(54) FIELD EFFECT TRANSISTOR INCLUDING GATE INSULATING LAYER FORMED OF TWO-DIMENSIONAL MATERIAL

(71) Applicants: Samsung Electronics Co., Ltd., Suwon-si (KR); SEOUL NATIONAL UNIVERSITY R&DB FOUNDATION, Seoul (KR)

(72) Inventors: Minhyun Lee, Suwon-si (KR); Minsu Seol, Suwon-si (KR); Ho Won Jang, Seoul (KR); Yeonchoo Cho, Suwon-si (KR); Hyeonjin Shin, Suwon-si (KR)

(73) Assignees: Samsung Electronics Co., Ltd, Gyeonggi-do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/171,502

(22) Filed: Feb. 20, 2023

(65) Prior Publication Data

US 2023/0197811 A1    Jun. 22, 2023

Related U.S. Application Data

(63) Continuation of application No. 17/060,696, filed on Oct. 1, 2020, now Pat. No. 11,588,034.

(30) Foreign Application Priority Data

Jan. 23, 2020    (KR) .................. 10-2020-0009396

(51) Int. Cl.
*H01L 29/423* (2006.01)
*H01L 29/04* (2006.01)
(Continued)

(52) U.S. Cl.
CPC ...... *H01L 29/42364* (2013.01); *H01L 29/045* (2013.01); *H01L 29/0665* (2013.01); *H01L 29/1606* (2013.01); *H01L 29/66439* (2013.01)

(58) Field of Classification Search
CPC ................... H01L 29/045; H01L 29/78696
See application file for complete search history.

(56) References Cited

U.S. PATENT DOCUMENTS 7,906,802 B2    3/2011    Baumgartner et al.
9,190,509 B2    11/2015   Nayfeh
(Continued)

FOREIGN PATENT DOCUMENTS

CN    107611033 A    1/2018
CN    108831928 A  * 11/2018    ............. H01L 29/24
(Continued)

OTHER PUBLICATIONS

R. Cheng et al., "Few-layer molybdenum disulfide transistors and circuits for high-speed flexible electronics," Nature Comm. Published Oct. 8, 2014.
(Continued)

*Primary Examiner* — Raj R Gupta
(74) *Attorney, Agent, or Firm* — Harness, Dickey & Pierce, P.L.C.

(57) ABSTRACT

Provided is a field effect transistor including a gate insulating layer having a two-dimensional material. The field effect transistor may include a first channel layer; a second channel layer disposed on the first channel layer; a gate insulating layer disposed on the second channel layer; a gate electrode disposed on the gate insulating layer; a first electrode electrically connected to the first channel layer; and a second electrode electrically connected to the second channel layer. Here, the gate insulating layer may include an insulative, high-k, two-dimensional material.

20 Claims, 7 Drawing Sheets

(51) Int. Cl.
  *H01L 29/06* (2006.01)
  *H01L 29/16* (2006.01)
  *H01L 29/66* (2006.01)

(56) References Cited

U.S. PATENT DOCUMENTS

| | | | |
|---|---|---|---|
| 10,263,107 | B2 | 4/2019 | Ozkan et al. |
| 11,588,034 | B2* | 2/2023 | Lee ................ H01L 29/517 |
| 2016/0141427 | A1 | 5/2016 | Chen et al. |
| 2016/0240692 | A1* | 8/2016 | Shepard ............ H01L 21/0262 |
| 2016/0265047 | A1 | 9/2016 | van Rooyen et al. |
| 2017/0098716 | A1* | 4/2017 | Li ...................... H01L 29/18 |
| 2018/0315852 | A1* | 11/2018 | Ozkan ............... H01L 21/02178 |

FOREIGN PATENT DOCUMENTS

| | | | |
|---|---|---|---|
| JP | 2012240884 A | * 12/2012 | ............ B32B 18/00 |
| KR | 10-2007-0044712 A | 4/2007 | |
| KR | 10-2013-0120969 A | 11/2013 | |
| KR | 10-2017-0030969 A | 3/2017 | |
| KR | 10-1838279 B1 | 3/2018 | |

OTHER PUBLICATIONS

H. Yang et al., "Graphene Barristor, a Triode Device with a Gate-Controlled Schottky Barrier," Science vol. 336, pp. 1140-1143, Jun. 1, 2012.

D. Sarkar et al., "A subthermionic tunnel field-effect transistor with an atomically thin channel," Nature, pp. 91-95, vol. 526, Oct. 1, 2015.

L. Britnell et al., "Field-Effect Tunneling Transistor Based on Vertical Graphene Heterostructures," Science, pp. 947-950, vol. 335, Feb. 24, 2012.

M.D. Tran et al., "Role of Hole Trap Sites in MoS2 for Inconsistency in Optical and Electrical Phenomena," ACS Appl. Mater. Interfaces 2018, 10, 10580?10586.

C. Lee et al., "Comparison of trapped charges and hysteresis behavior in hBN encapsulated single MoS2 flake based field effect transistors on SiO2 and hBN substrates," Nanotechnology 29,335202, Published Jun. 11, 2018.

M. Osada et al., "Two-Dimensional Dielectric Nanosheets: Novel Nanoelectronics From Nanocrystal Building Blocks," Advanced Materials 2012, 24, 210-228.

M. Osada et al., "Exfoliated oxide nanosheets: new solution to nanoelectronics," Journal of Materials Chemistry, 19, pp. 2503-2511, published Mar. 18, 2009.

Laturia Akash et al: "Dielectric properties of hexagonal boron nitride and transition metal dichalcogenides: from monolayer to bulk", NPJ 2D Materials and Applications, vol. 2, No. 1, Dec. 1, 2018.

Rabin Nurun Nahar et al: "Super Dielectric Materials of Two-Dimensional TiO2 or Ca Nb 3 0 10 Nanosheet Hybrids with Reduced Graphene Oxide", ACS Omega, vol. 3, No. 2, Feb. 28, 2018, pp. 2074-2083.

Weng Junhui et al: "A honeycomb-like monolayer of HfO2 and the calculation of static dielectric constant eliminating the effect of vacuum spacing", Phys. Chem. Chem., vol. 20, No. 20, Jan. 1, 2018, pp. 26453-26462.

Ajayan Pulickel et al: "Two Dimensional van der Waals materials", Physics Today., vol. 69, No. 9, Sep. 1, 2016, pp. 38-44.

Extended European Search report issued Jun. 8, 2021 in European Application No. 21152508.4.

Non-Final Office Action issued on May 26, 2022 in U.S. Appl. No. 17/060,696.

Notice of Allowance issued on Oct. 25, 2022 in U.S. Appl. No. 17/060,696.

* cited by examiner

FIELD EFFECT TRANSISTOR INCLUDING GATE INSULATING LAYER FORMED OF TWO-DIMENSIONAL MATERIAL

CROSS-REFERENCE TO RELATED APPLICATIONS

This application is a continuation of U.S. application Ser. No. 17/060,696, filed on Oct. 1, 2020, which claims the benefit of Korean Patent Application No. 10-2020-0009396, filed on Jan. 23, 2020, in the Korean Intellectual Property Office, the disclosure of each of which is incorporated herein in its entirety by reference.

BACKGROUND

1. Field

The present disclosure relates to a field effect transistor including a gate insulating layer having a two-dimensional material, and more particularly, to a field effect transistor including a gate insulating layer having a high-k two-dimensional material.

2. Description of Related Art

Graphene is a material having a two-dimensional (2D) hexagonal structure in which carbon atoms are connected to each other in a hexagonal shape in one plane, and the thickness of graphene is merely about the thickness of one layer of atoms. Graphene is in the spotlight as a next-generation material because graphene has very stable electrical, mechanical, and chemical properties and high conductivity due to its two-dimensional structure. After the discovery of graphene's 2D properties, research has also been conducted in various two-dimensional materials besides graphene, and into the fabrication of devices using the various two-dimensional materials.

For example, many attempts have been made to use two-dimensional materials as channels for field effect transistors. When two-dimensional materials are used as channels of field effect transistors, high mobility may be achieved, with expected reduced leakage current because the short channel effects are suppressed. However, when a two-dimensional material is used as a channel of a field effect transistor, the mobility of charges in the channel may be limited because the charges may be trapped at a surface of a gate insulating layer between the gate insulating layer and the channel due to dangling bonds of the gate insulating layer.

SUMMARY

Provided are field effect transistors including a gate insulating layer having a two-dimensional material.

Additional aspects will be set forth in part in the description which follows and, in part, will be apparent from the description, or may be learned by practice of the presented embodiments of the disclosure.

According to an aspect of some example embodiments, a field effect transistor includes: a first channel layer; a second channel layer on the first channel layer; a gate insulating layer insulting an insulative, high-k, two-dimensional material on the second channel layer; a gate electrode on the gate insulating layer; a first electrode electrically connected to the first channel layer; and a second electrode electrically connected to the second channel layer.

For example, the insulative, high-k, a two-dimensional material may have a dielectric constant of about 10 or more.

For example, the gate insulating layer may include at least one of an oxide nanosheet having a two-dimensional crystal structure, a layered perovskite having a two-dimensional crystal structure, or a ferroelectric material having a two-dimensional crystal structure.

For example, the oxide nanosheet having the two-dimensional crystal structure may include at least one of $TiO_x$, $TiNbO_x$, $TiTaO_x$, $NbO_x$, $TaO_x$, $LaNbO_x$, $CaNbO_x$, $SrNbO_x$, $BaTaO_x$, $WO_x$, and $TiCoO_x$.

For example, the layered perovskite having a two-dimensional crystal structure may include at least one of $LaNb_2O_7$, $LaEuNb_4O_{14}$, $EuTa_4O_{14}$, $SrTa_2O_7$, $Bi_2SrTa_2O_9$, $Ca_2Nb_3O_{10}$, $La_2Ti_2NbO_{10}$, $Ba_5Ta_4O_{15}$, and $W_2O_7$.

For example, the ferroelectric material having a two-dimensional crystal structure may include at least one of $In_2Se_2$, $HfZrO_2$, and $Si-HfO_2$.

In addition, for example, the insulative, high-k, two-dimensional material may include at least one of 1T-$HfO_2$, 1T-$ZrO_2$, 1T-$GeO_2$, 1T-$SnO_2$, 1T-$TiO_2$, 1T-$PtO_2$, 2H—$GeO_2$, 2H—$HfO_2$, 1T-$HfS_2$, 1T-$PdO_2$, 2H—$ZrO_2$, 1T-$PtS_2$, 2H—$MoO_2$, 2H—$WO_2$, and 1T-$SnS_2$.

At least one of the first channel layer and the second channel layer may include a semiconductor material having a two-dimensional crystal structure.

For example, the semiconductor material having the two-dimensional crystal structure may include at least one of graphene, black phosphorus, phosphorene, and a transition metal dichalcogenide.

For example, the transition metal dichalcogenide may include at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

The second channel layer may include a semiconductor material having a two-dimensional crystal structure, and the second channel layer and the gate insulating layer may be van-der-Waals bonded to each other. In this case, an interface charge density between the second channel layer and the gate insulating layer may be $1 \times 10^{12}$ per $cm^2$ or less.

In addition, the field effect transistor may have a sub-threshold swing value of about 60 mV/dec or less.

The first channel layer and the second channel layer may have energy bands different from each other.

In an example, the first channel layer and the second channel layer may include different semiconductor materials and may be doped to have an electrically identical conductivity type.

In another example, the first channel layer may be doped to have a first conductivity type, and the second channel layer may be doped to have a second conductivity type which may be electrically opposite to the first conductivity type.

In an example, the first channel layer and the second channel layer may include an identical semiconductor material.

In another example, the first channel layer and the second channel layer may include different semiconductor materials.

The gate insulating layer may be disposed to cover a portion of an upper surface of the second channel layer.

The gate insulating layer and the gate electrode may protrude in a lateral direction toward the first electrode from a first edge of the second channel layer such that the gate insulating layer and the gate electrode may extend onto an upper surface of the first electrode, or the gate insulating layer and the gate electrode may be disposed to protrude in a lateral direction toward the second electrode from a second edge of the second channel layer such that the gate insulating layer and the gate electrode may extend onto an upper surface of the second electrode.

The field effect transistor may further include an insulator layer disposed between the first channel layer and the second channel layer.

The insulator layer may have a thickness of about 1 nm to about 5 nm.

The insulator layer may be disposed to cover an entire upper surface of the first channel layer, and the second channel layer may cover a portion of an upper surface of the insulator layer.

The insulator layer and the second channel layer may protrude in a lateral direction toward the second electrode from an edge of the first channel layer.

The field effect transistor may further include a substrate which is insulative, wherein the first channel layer may be on an upper surface of the substrate.

The second channel layer may be disposed to cover a portion of an upper surface of the first channel layer, a portion of the second channel layer may protrude in a lateral direction toward the second electrode from an edge of the first channel layer, and the portion of the second channel layer protruding towards the second electrode may be spaced apart from the substrate.

The second channel layer may cover a portion of an upper surface of the first channel layer, a portion of the second channel layer may protrude in a lateral direction toward the second electrode from an edge of the first channel layer, and the portion of the second channel layer protruding towards the second electrode may extend in contact with the upper surface of the substrate.

The field effect transistor may further include a first contact layer disposed on the substrate to be in direct contact with the first channel layer; and a second contact layer on the substrate to be in direct contact with the second channel layer.

In this case, the first electrode may be on the first contact layer, and the second electrode may be on the second contact layer.

In addition, the field effect transistor may further include: a lower gate insulating layer embedded in the substrate and in contact with a lower surface of the first channel layer; and a lower gate electrode embedded in the substrate and in contact with a lower surface of the lower gate insulating layer.

The lower gate insulating layer may include an insulative, high-k, two-dimensional material.

The first channel layer and the second channel layer may both include a two-dimensional crystalline semiconductor.

The field effect transistor may be a tunneling field effect transistor.

The field effect transistor may be method produced by a comprising: forming a first channel layer on a substrate; forming a second channel layer to partially cover an upper surface of the first channel layer; forming a gate insulating layer on an upper surface of the second channel layer, the gate insulating layer including an insulative, high-k, two-dimensional material; and forming a first electrode contacting the first channel layer; forming a second electrode contacting the second channel layer; and forming a gate electrode contacting an upper surface of the gate insulating layer.

The method may further comprise forming a support layer before the forming of the second channel layer and patterning the support layer.

The method may further comprise removing the support layer after the forming of the second electrode.

The forming of the first electrode, the second electrode, and the gate electrode may be performed in a simultaneous process.

The method may further comprise forming an insulator layer on the first channel layer before the forming of the second channel layer.

The method may further comprise patterning the substrate to include a trench; partially filling the trench with a lower gate electrode; and covering the lower gate electrode with a lower gate insulating layer. The lower gate insulating layer may comprise an insulative, high-k, two-dimensional material.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, field effect transistors including a gate insulating layer having a two-dimensional material will be described in detail with reference to the accompanying drawings. In the drawings, like reference numerals refer to like elements, and the sizes of elements may be exaggerated for clarity of illustration. In addition, embodiments described herein are for illustrative purposes only, and various modifications may be made therefrom.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

Spatially relative terms, such as "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Examples or exemplary terms are just used herein to describe technical ideas and should not be considered for purposes of limitation unless defined by the claims.

Figure 1A:
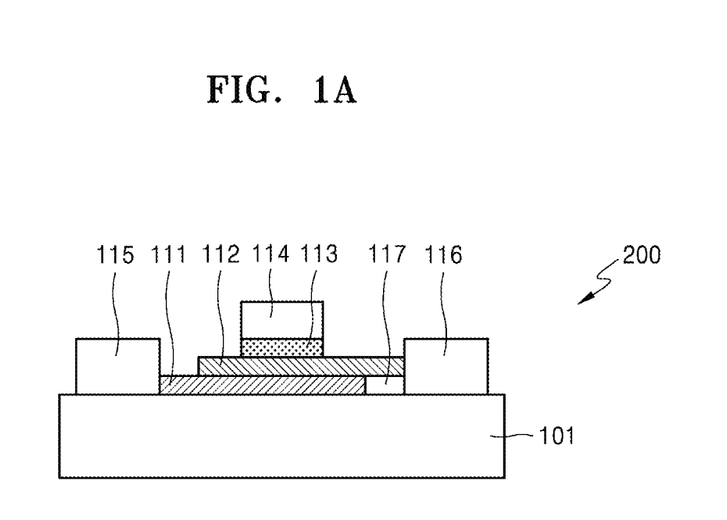
FIG. 1A to 1B are cross-sectional views schematically illustrating a configuration of a field effect transistor according to some example embodiments.

FIG. 1A is a cross-sectional view schematically illustrating a configuration of a field effect transistor 200 according to some example embodiments. Referring to FIG. 1A, the field effect transistor 200 according to the example embodiment may include a first channel layer 111, a second channel layer 112 on the first channel layer 111, a gate insulating layer 113 on the second channel layer 112, a gate electrode 114 on the gate insulating layer 113, a first source/drain electrode 115 electrically connected to the first channel layer 111, and a second source/drain electrode 116 electrically connected to the second channel layer 112.

The first channel layer 111, the first source/drain electrode 115, and the second source/drain electrode 116 may be on an upper surface of a substrate 101. A substrate 101 may be, for example, an insulative substrate including a material such as glass, plastic, or $Al_2O_3$. The first source/drain electrode 115 may be on the substrate 101 and may be in contact with a first edge of the first channel layer 111. In addition, the second source/drain electrode 116 is on the substrate 101 and may be adjacent to a second edge of the first channel layer 111, which is opposite the first edge of the first channel layer 111. The second source/drain electrode 116 may be spaced apart and/or separated from the first channel layer 111 but may be in contact with a second edge of the second channel layer 112. Similarly, the first source/drain electrode 115 may be adjacent to a first edge of the second channel layer 112, but may be spaced apart and/or separated from the second channel layer 112.

The second channel layer 112 may be on an upper surface of the first channel layer 111. The second channel layer 112 may cover only a portion of the upper surface of the first channel layer 111. For example, the second end of the second channel layer 112 may be spaced apart from the first edge of the first channel layer 111 such that the second channel layer 112 may not contact the first source/drain electrode 115 on the first edge of the first channel layer 111. In other words, a first edge of the second channel layer 112 may be in a stepped form at a distance from the first edge of the first channel layer 111. In addition, the second channel layer 112 may protrude in a lateral direction from an edge of the first channel layer 111 toward the second source/drain electrode 116 such that the second channel layer 112 may be in contact with the second source/drain electrode 116. In other words, a second edge of the second channel layer 112 may protrude in the lateral direction with respect to the second edge of the first channel layer 111. Therefore, the second channel layer 112 may be shifted in the lateral direction with reference to the first channel layer 111.

The second edge portion of the second channel layer 112 protruding with respect to the second edge of the first channel layer 111 may be spaced apart from the substrate 101. For example, an empty space 117 may be formed between the second edge portion of the second channel layer 112 and the substrate 101. In another example embodiment, a support layer (not illustrated) including an insulative material may be in the empty space 117 between the second edge portion of the second channel layer 112 and the substrate 101.

The first channel layer 111 and the second channel layer 112 may include semiconductor materials having different energy bands. In this example embodiment, as long as the first channel layer 111 and the second channel layer 112 have different energy bands, the first channel layer 111 and the second channel layer 112 may include any semiconductor materials.

For example, the first channel layer 111 and the second channel layer 112 may include the same semiconductor material and may be doped to have electrically opposite conductivity types. In other words, when the first channel layer 111 and the second channel layer 112 include the same semiconductor material, the first channel layer 111 may be doped with a p-type dopant and the second channel layer 112 may be doped with an n-type dopant, or the first channel layer 111 may be doped with an n-type dopant and the second channel layer 112 may be doped with a p-type dopant. Alternatively, when the first channel layer 111 and the second channel layer 112 include the same semiconductor material, the first channel layer 111 and the second channel layer 112 may have different doping concentrations. For example, only one of the first channel layer 111 and the second channel layer 112 may include a dopant, while the other channel layer may include less and/or no dopants.

In another example, the first channel layer 111 and the second channel layer 112 may include different semiconductor materials. When the first channel layer 111 and the second channel layer 112 include different semiconductor materials and have different energy bands, the first channel layer 111 and the second channel layer 112 may be doped to have electrically the same conductivity type or electrically opposite conductivity types, or only one of the first channel layer 111 and the second channel layer 112 may be doped, or both of the first channel layer 111 and the second channel layer 112 may not be doped. The doping of the first channel layer 111 and the second channel layer 112 may, for example, include doping the semiconductor materials with a dopant and/or through contact doping.

In addition, at least one of the first channel layer 111 and the second channel layer 112 may include a semiconductor material having a two-dimensional crystal structure. For example, the first channel layer 111 may include a semiconductor material having a general three-dimensional crystal structure such as silicon (Si), germanium (Ge), a Group III-V compound semiconductor, and/or indium gallium zinc oxide (IGZO), and the second channel layer 112 may include a semiconductor material having a two-dimensional crystal structure. Alternatively, the first channel layer 111 may include a semiconductor material having a two-dimensional crystal structure, and the second channel layer 112 may include a semiconductor material having a general three-dimensional crystal structure. Alternatively, both the first channel layer 111 and the second channel layer 112 may include a semiconductor material having a two-dimensional crystal structure.

A two-dimensional crystal structure may include a crystalline structure of various elements, units, and/or compounds arranged in a two-dimensional lattice. Though the atoms, units, and/or components comprising the two-dimensional crystal structure may exist above and/or below a two-dimensional plane, the 2D lattice may comprise vertices ordered in a single sheet. The sheet may be flat and/or curved, but the atoms, units, and/or compounds do not repeat beyond a single order above or below the sheet. A two dimensional crystal structure is in contrast to a one-dimensional material (e.g., a nanowire) and/or a three-dimensional (3D) crystal, which may comprise an ordered structure in three dimensions. For example, in the case of a crystalline and/or polycrystalline 3D material, a 3D material would include a 3D lattice structure comprising elements and/or compounds, defining crystal units, bonded with covalent, ionic, and/or metallic bounds; the units defining vertices in the 3D lattice.

The semiconductor material having a two-dimensional crystal structure may include, for example, a carbon-based two-dimensional material such as graphene, or a non-carbon-based two-dimensional material such as black phosphorus, phosphorene, or a transition metal dichalcogenide. The transition metal dichalcogenide is a compound of a transition metal and a chalcogen, and examples of the transition metal dichalcogenide may include $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$. In addition, examples of the semiconductor material having a two-dimensional crystal structure may include $MnOx$, $VaOx$, $MnO_3$, $MoCl_2$, $CrCl_3$, $RuCl_3$, $BiI_3$, $PbCl_4$, $GeS$, $GaS$, $GeSe$, $GaSe$, $PtSe_2$, $GaTe$, $InS$, $InSe$, and $InTe$.

The gate insulating layer 113 may be on an upper surface of the second channel layer 112 and may include an insulative two-dimensional material. The insulative two-dimensional material may be, for example, a topological insulator, such that the material, despite its relative thickness, can prevent and/or mitigate the exchange of charge carriers through the insulative two-dimensional materials. The insulative two-dimensional material may include a quantum well formed because of the two-dimensional fold symmetry of the insulative two-dimensional across the two-dimensional sheet, and may strongly suppress even quantum tunneling of charge carriers through the two-dimensional material. In addition, the gate insulating layer 113 may include a high-k material having a high dielectric constant within the range of 10 or more. When the gate insulating layer 113 has high-k characteristics, the gate insulating layer 113 may have a physically large thickness while having a small equivalent oxide thickness (EOT), and thus current leakage through the gate insulating layer 113 may be suppressed. Therefore, the field effect transistor 200 may be manufactured more finely and may be free of leakage current. To increase the physical thickness of the gate insulating layer 113 including a two-dimensional material, the gate insulating layer 113 may be formed by repeatedly stacking the two-dimensional material in a plurality of layers. Similarly, the first channel layer 111 and the second channel layer 112 may include a single layer (e.g., a monolayer) of the two-dimensional materials and/or may include a plurality of layers. In the case of a layered structure, the layers of the two-dimensional crystals may be bonded by van der Waal forces, and may comprise, for example, a van der Waals heterostructure and/or a homostructure. For example, in the case wherein the second channel layer 112 and the gate insulating layer 113 include materials with two-dimensional crystalline structures, the second channel layer 112 and the gate insulating layer 113 may comprise a van der Waals heterostructure comprising stacked van der Waals homostructures. The orientation of the two-dimensional materials in the first channel layer 111, the second channel layer 11, and/or the gate insulating layer 113 may run parallel to the direction in which the first source/drain electrode 115 and the second source/drain electrode 116 are spaced apart. For example, the layer and/or layers of two-dimensional materials may be substantially parallel to the substrate 101.

Examples of an insulative, high-k, two-dimensional material may include an oxide nanosheet having a two-dimensional crystal structure, a layered perovskite having a two-dimensional crystal structure, and a ferroelectric material having a two-dimensional crystal structure. The oxide nanosheet having a two-dimensional crystal structure may include, for example, at least one selected from the group consisting of $TiO_x$, $TiNbO_x$, $TiTaO_x$, $NbO_x$, $TaO_x$, $LaNbO_x$, $CaNbO_x$, $SrNbO_x$, $BaTaO_x$, $WO_x$, and $TiCoO_x$. In addition, the layered perovskite having a two-dimensional crystal structure may include at least one selected from the group consisting of $LaNb_2O_7$, $LaEuNb_4O_{14}$, $EuTa_4O_{14}$, $SrTa_2O_7$, $Bi_2SrTa_2O_9$, $Ca_2Nb_3O_{10}$, $La_2Ti_2NbO_{10}$, $Ba_5Ta_4O_{15}$, and $W_2O_7$. In addition, the ferroelectric material having a two-dimensional crystal structure may include at least one selected from the group consisting of $In_2Se_2$, $HfZrO_2$, and $Si-HfO_2$. In addition, an insulative, high-k, two-dimensional material that may be used to form the gate insulating layer 113 may include $1T-HfO_2$, $1T-ZrO_2$, $1T-GeO_2$, $1T-SnO_2$, $1T-TiO_2$, $1T-PtO_2$, $2H-GeO_2$, $2H-HfO_2$, $1T-HfS_2$, $1T-PdO_2$, $2H-ZrO_2$, $1T-PtS_2$, $2H-MoO_2$, $2H-WO_2$, $1T-SnS_2$, or the like. Here, "1T-" denotes crystallinity having a structure in which the stacking symmetry of a layered structure is tetragonal, and "2H—" denotes crystallinity having a hexagonal symmetrical structure.

In general, when a channel including a material having a two-dimensional crystal structure and a gate insulating layer including a material having a three-dimensional crystal structure are used, charge may be trapped in a surface of the gate insulating layer between the gate insulating layer and the channel due to dangling bonds of the three-dimensional material which are present on the surface of the gate insulating layer, and thus, charge mobility in the channel may be limited.

In the present embodiment, however, because the gate insulating layer 113 includes a two-dimensional material, dangling bonds are not present on the surface of the gate insulating layer 113. In addition, when the second channel layer 112, which is in contact with the gate insulating layer 113, includes a semiconductor material having a two-dimensional crystal structure, there is no dangling bond on the surface of the second channel layer 112. In this case, there is only van der Waals bonding between the second channel layer 112 and the gate insulating layer 113. Therefore, charge is not trapped due to dangling bonds in the interface between the second channel layer 112 and the gate insulating layer 113, and thus, the interface charge density between the second channel layer 112 and the gate insulating layer 113 may be maintained at a very low level. For example, the interface charge density between the second channel layer 112 and the gate insulating layer 113 may be about $1 \times 10^{12}$ per $cm^2$ or less. Therefore, the field effect transistor 200 of the present embodiment may have high charge mobility, and when the field effect transistor 200 is in an OFF state, off-current flowing between the first source/drain electrode 115 and the second source/drain electrode 116 may be further reduced.

The first source/drain electrode 115 and the second source/drain electrode 116 may include a metal such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), or bismuth (Bi), or may include an alloy thereof. In addition, the gate electrode 114 may include polysilicon or the same metallic material as that included in the first and second source/drain electrodes 115 and 116.

In the field effect transistor 200 having the above-described structure, when a voltage equal to or higher than a threshold voltage is applied to the gate electrode 114, current flows between the first source/drain electrode 115 and the second source/drain electrode 116. In the present embodiment, the first channel layer 111 is electrically connected only to the first source/drain electrode 115, the second channel layer 112 is electrically connected only to the second source/drain electrode 116, and the first channel layer 111 and the second channel layer 112 have different energy bands, such that charge may move between the first channel layer 111 and the second channel layer 112 by a tunneling phenomenon. Therefore, the field effect transistor 200 of the present embodiment is a tunneling field effect transistor.

In a general field effect transistor, current flowing through a channel is determined by the flow of electrons having energy greater than the barrier of the channel. In addition, because the energy distribution of electrons follows the Fermi-Dirac distribution, the theoretical limit of a subthreshold swing value which indicates the switching speed of a transistor is given as $\ln(10)kT/q$. Here, k refers to the Boltzmann constant, T refers to absolute temperature, and q refers to the magnitude of the electrical charge on the electron. Therefore, the subthreshold swing value of a general field effect transistor may not decrease to 60 mV/dec or less at room temperature.

In the field effect transistor 200 of the present example embodiment, current flowing in the first channel layer 111 and the second channel layer 112 is determined by the quantum mechanical probability that electrons may pass through a tunneling layer formed between the first channel layer 111 and the second channel layer 112. For this reason, the limit of the subthreshold swing value of the field effect transistor 200 of the present embodiment is not determined by the above-mentioned expression: $\ln(10)kT/q$. Therefore, the subthreshold swing value of the field effect transistor 200 of the present embodiment may be about 60 mV/dec or less. Therefore, the field effect transistor 200 of the present embodiment may perform very fast switching.

Figure 1B:
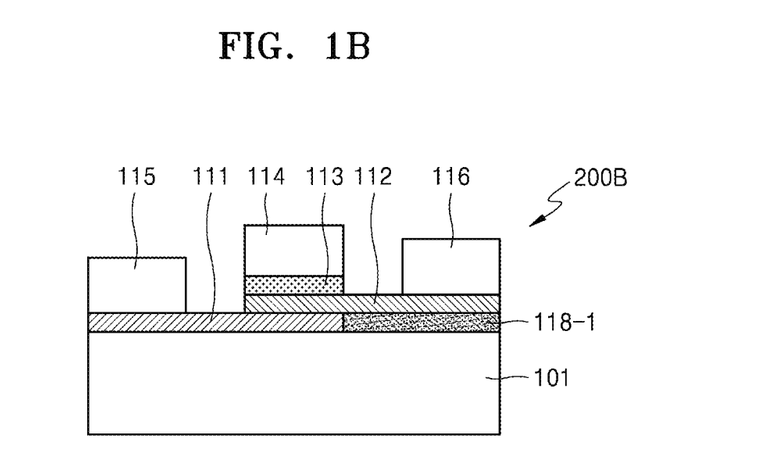

FIG. 1B is a cross-sectional view schematically illustrating an example configuration of a field effect transistor 200B according to some example embodiments. The field effect transistor 200B illustrated in FIG. 1B may be the same as the field effect transistor 200 of FIG. 1B, except the field effect transistor 200 of FIG. 1A, the field effect transistor 200B may include the first source/drain electrode 115 on a region of the first channel layer 111, and the second source/drain electrode 116 on a region of the second channel layer 112. The second channel layer 112 and the second electrode may be spaced apart from the substrate 101 and may be supported by a support layer 118-1. The support layer 118-1 may include, for example, a semiconductor and/or an insulator. The support layer 118-1 may be part of the substrate, patterned to include a step and/or formed on the substrate before the formation of the second channel layer 112. Though not illustrated, an empty space may remain under the second channel layer 112.

The first source/drain electrode 115 and the gate electrode 114 may also be under the first channel layer 111. For example, though not illustrated as such, the first source/drain electrode 115 and/or the gate electrode 114 may be formed in the substrate 101. The field effect transistor 200B of FIG. 1B, wherein the gate electrode 114, the first source/drain electrode 115, and the second source/drain electrode 116 are above the first and second channel layers 111 and 112, may be referred to as a top gate transistor. However, in the case wherein the gate electrode 114 is under the first channel layer 111 and the first source/drain electrode 115 and the second source/drain electrode 116 are above the first and second channel layers 111 and 112, the field effect transistor may be referred to as a bottom gate transistor.

FIGS. 2A to 2E are cross-sectional views schematically illustrating a process of manufacturing the field effect transistor 200 shown in FIG. 1A.

Figure 2A:
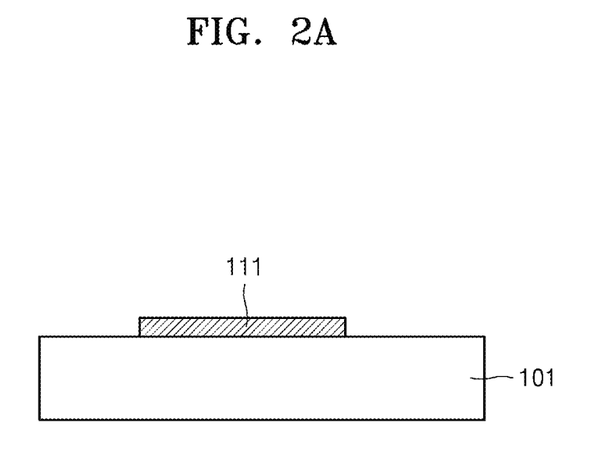
FIGS. 2A to 2E are cross-sectional views schematically illustrating a process of manufacturing the field effect transistor shown in FIG. 1A.

Referring to FIG. 2A, a first channel layer 111 is formed on a substrate 101. For example, after forming the material of the first channel layer 111 on the entire upper surface of the substrate 101 by a method such as chemical vapor deposition (CVD), the material of the first channel layer 111 may be patterned to form the first channel layer 111. The first channel layer 111 may also be formed on the substrate 101 by transferring a first channel layer material layer (not illustrated) onto the substrate.

Figure 2B:
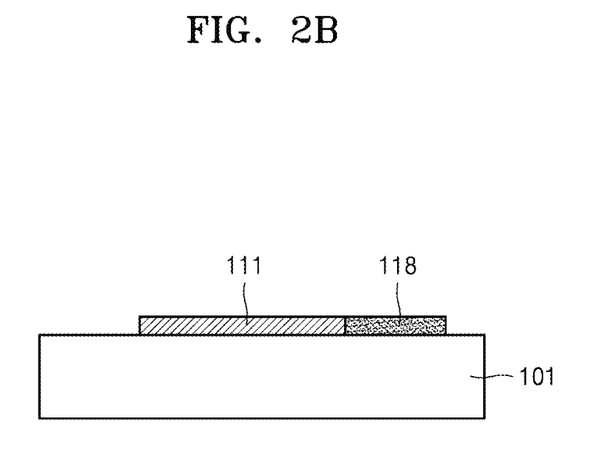

Referring to FIG. 2B, a support layer 118 may be formed adjacent to a second edge of the first channel layer 111. The support layer 118 may include an insulative material. For example, the support layer 118 may include the same two-dimensional material as a gate insulating layer 113. Alternatively, the support layer 118 may include a general three-dimensional dielectric material.

Figure 2C:
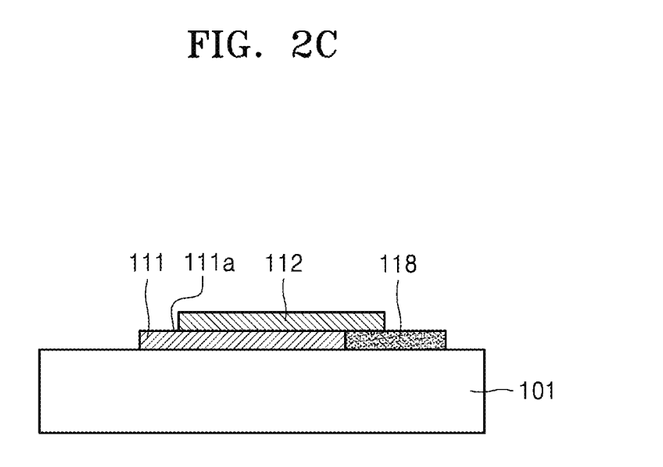

Referring to FIG. 2C, a second channel layer 112 is formed on the first channel layer 111 and the support layer 118. For example, after forming the material of the second channel layer 112 on upper surfaces of the substrate 101, the first channel layer 111, and the support layer 118 by a method such as CVD, the material may be patterned to form the second channel layer 112. The second channel layer 112 may also be formed on another substrate and transferred onto the upper surface of the first channel layer 111 and the support layer 118. As shown in FIG. 2C, the material of the second channel layer 112 may be patterned and/or positioned in such a manner that an upper surface 111a of a first edge of the first channel layer 111 is partially exposed, and the first edge of the first channel layer 111 protrudes from a first edge of the second channel layer 112. In addition, the second channel layer 112 may be patterned in such a manner that a second edge of the second channel layer 112 remains partially on a portion of the upper surface of the support layer 118, and the second edge of the second channel layer 112 protrudes from the second edge of the first channel layer 111.

Figure 2D:
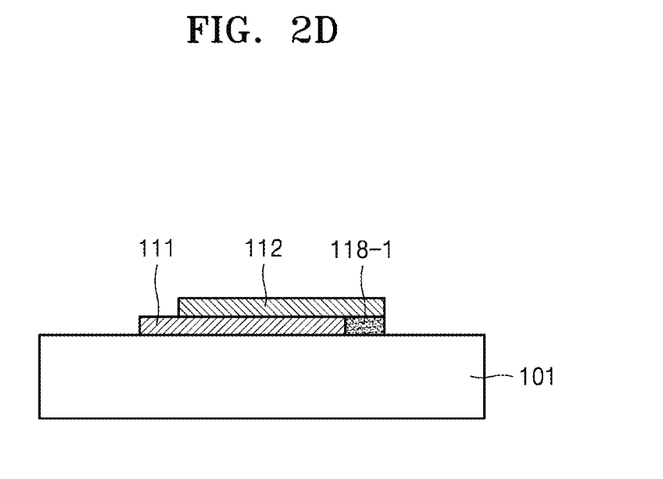

Referring to FIG. 2D, an exposed portion of the support layer 118 may be removed while leaving a portion of the support layer 118-1, which is under the second channel layer 112. The removal process of the support layer 118 shown in FIG. 2D may be performed simultaneously with the process shown in FIG. 2C. For example, when the material of the second channel layer 112 is formed and is then patterned, a portion of the support layer 118 that is not under the second channel layer 112 may be removed together. Alternatively, after the second channel layer 112 is formed, an exposed portion of the support layer 118 may be removed in a separate process.

Figure 2E:
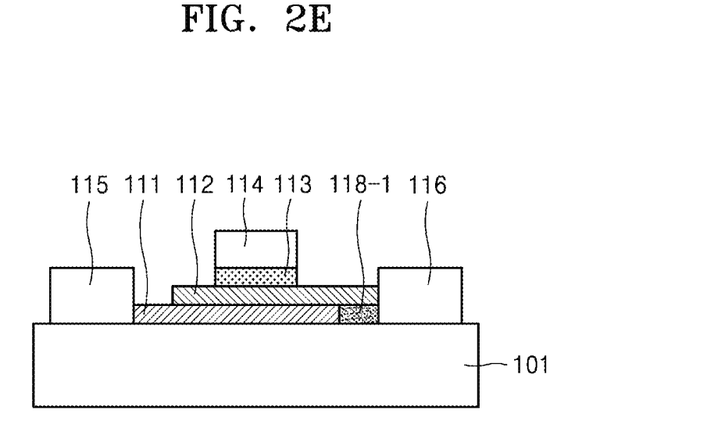

Referring to FIG. 2E, the gate insulating layer 113 is formed on the second channel layer 112. For example, after forming the material of the gate insulating layer 113 on an upper surface the second channel layer 112 by a method such as CVD, the gate insulating material may be patterned to form the gate insulating layer 113. The gate insulating layer 113 may also be formed on another substrate and transferred onto the upper surface of the second channel layer 112. Thereafter, a gate electrode 114 may be formed on the gate insulating layer 113. In addition, a first source/drain electrode 115 may be formed on the substrate 101 such that the first source/drain electrode 115 may be in electrical contact with the first edge of the first channel layer 111, and a second source/drain electrode 116 may be formed on the substrate 101 such that the second source/drain electrode 116 may be in electrical contact with the second edge of the second channel layer 112. When the gate electrode 114, the first source/drain electrode 115, and the second source/drain electrode 116 include the same metallic material, the gate electrode 114, the first source/drain electrode 115, and the second source/drain electrode 116 may be simultaneously formed.

The support layer 118-1 may be left such that the support layer 118 may support a second edge portion of the second channel layer 112. However, when it is possible to support the second edge portion of the second channel layer 112 by the second source/drain electrode 116, the support layer 118-1 may be removed after the second source/drain electrode 116 is formed. Then, an empty space 117 may remain under the second channel layer 112. In this case, the support layer 118-1 may serve as a sacrificial layer.

Figure 3:
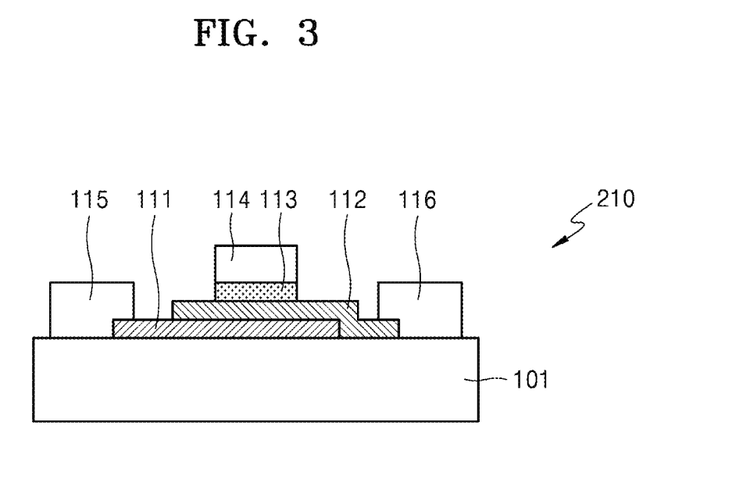
FIG. 3 is a cross-sectional view schematically illustrating a configuration of a field effect transistor according to some example embodiments.

In FIGS. 1A and 1B, the second edge of the second channel layer 112 is illustrated as being spaced apart from the upper surface of the substrate 101, but this is a non-limiting example. For example, FIG. 3 is a cross-sectional view schematically illustrating a configuration of a field effect transistor 210 according to some example embodiments. Referring to FIG. 3, in the field effect transistor 210, a second channel layer 112 may cover a portion of an upper surface of a first channel layer 111 and a portion of a substrate 101. For example, the second channel layer 112 may cover a portion of the upper surface of the first channel layer 111 except for a portion of an upper surface of a first edge of the first channel layer 111. In addition, the second channel layer 112 may extend along an upper surface of a second edge of the first channel layer 111 and a lateral surface of the first channel layer 111 to make contact with an upper surface of the substrate 101. Therefore, a second edge portion of the second channel layer 112, which protrudes in a lateral direction from the second edge of the first channel layer 111 toward a second source/drain electrode 116, may be in contact with the upper surface of the substrate 101.

Furthermore, in the embodiment shown in FIG. 3, a first source/drain electrode 115 may cover a portion of the upper surface of the first channel layer 111. For example, a portion of the first source/drain electrode 115 may cover the upper surface of the first edge of the first channel layer 111, and the other portion of the first source/drain electrode 115 may be on the upper surface of the substrate 101. A portion of the second source/drain electrode 116 may cover an upper surface of the second edge of the second channel layer 112, and the other portion of the second source/drain electrode 116 may be on the upper surface of the substrate 101. The other elements of the field effect transistor 210 shown in FIG. 3 are the same as those of the field effect transistor 200 described with reference to in FIG. 1A. Similarly, the process of manufacturing the field effect transistor 210 may be substantially similar to the process of manufacturing the field effect transistor 200, but without the formation, patterning, and removal of the support layer 118.

Figure 4:
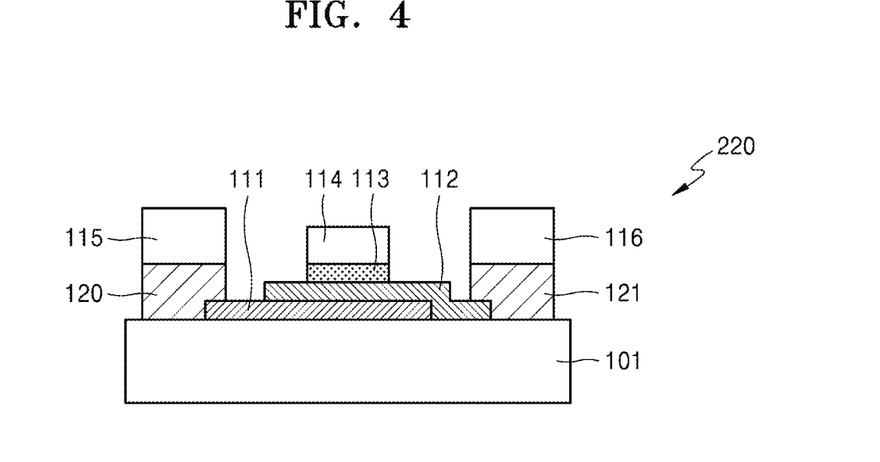
FIG. 4 is a cross-sectional view schematically illustrating a configuration of a field effect transistor according to some example embodiments.

FIG. 4 is a cross-sectional view schematically illustrating a configuration of a field effect transistor 220 according to another example embodiment. Referring to FIG. 4, the field effect transistor 220 may further include a first contact layer 120 between a first channel layer 111 and a first source/drain electrode 115, and a second contact layer 121 between a second channel layer 112 and a second source/drain electrode 116. For example, the first contact layer 120 may be on the substrate 101 and may extend to partially cover an upper surface of a first edge of the first channel layer 111. In addition, the second contact layer 121 may be on the substrate 101 and may extend to partially cover an upper surface of a second edge of the second channel layer 112.

In addition, the first source/drain electrode 115 may be on an upper surface of the first contact layer 120, and the second source/drain electrode 116 may be on an upper surface of the second contact layer 121. Therefore, the first source/drain electrode 115 may be connected to the first channel layer 111 through the first contact layer 120, and the second source/ drain electrode 116 may be connected to the second channel layer 112 through the second contact layer 121. The first contact layer 120 and the second contact layer 121 may include, for example, a semiconductor material having a three-dimensional crystal structure. When both the first and second channel layers 111 and 112 include a semiconductor material having a two-dimensional crystal structure, the first and second contact layers 120 and 121 may improve contact characteristics between the first and second channel layers 111 and 112 and the first and second source/drain electrodes 115 and 116.

Moreover, as in the field effect transistor 200 shown in FIGS. 1A and 1B, the gate insulating layer 113 may cover only a portion of the upper surface of the second channel layer 112. For example, the gate insulating layer 113 may be on a center portion of the upper surface of the second channel layer 112, and upper surfaces of the first and second edges of the second channel layer 112 may be exposed. In addition, the gate electrode 114 on the gate insulating layer 113 may be located only at the center portion of the upper surface of the second channel layer 112. In another example, the gate insulating layer 113 and/or gate electrode 114 may cover a region defined by the contact interface between the upper surface of the first channel layer 111 and the bottom surface of the second channel layer 112. However, the positions of the gate insulating layer 113 and the gate electrode 114 are not limited thereto.

Figure 5:
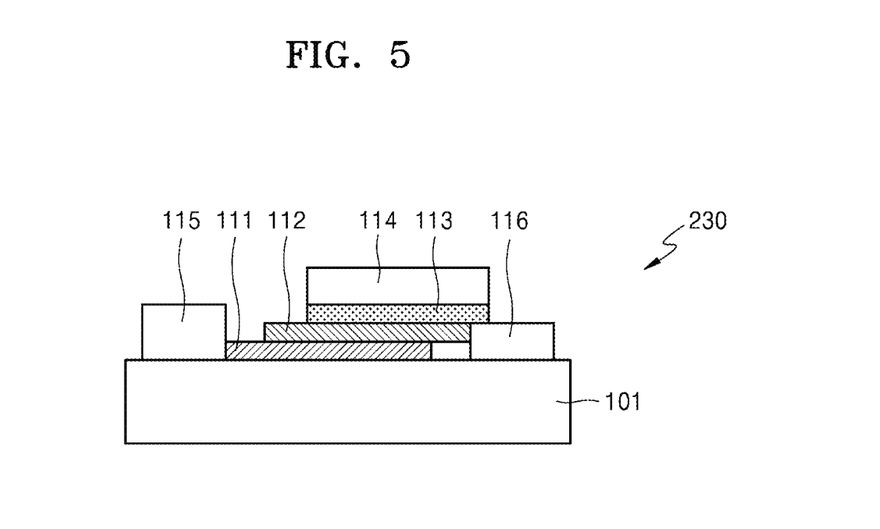
FIG. 5 is a cross-sectional view schematically illustrating a configuration of a field effect transistor according to some example embodiments.

For example, FIG. 5 is a cross-sectional view schematically illustrating a configuration of a field effect transistor 230 according to some example embodiments. Referring to FIG. 5, in the field effect transistor 230, a gate insulating layer 113 may protrude in a lateral direction from a second edge of a second channel layer 112 toward a second source/drain electrode 116 such that the gate insulating layer 113 may extend onto an upper surface of the second source/drain electrode 116. In addition, a gate electrode 114 on the gate insulating layer 113 may also protrude in the lateral direction from the second edge of the second channel layer 112 such that the gate electrode 114 may extend above the upper surface of the second source/drain electrode 116. To this end, the height of the upper surface of the second source/drain electrode 116 may be the same as the height of an upper surface of the second channel layer 112. Then, because the gate electrode 114 is widened, an electric field may be applied to larger areas of the first channel layer 111 and the second channel layer 112.

Figure 6:
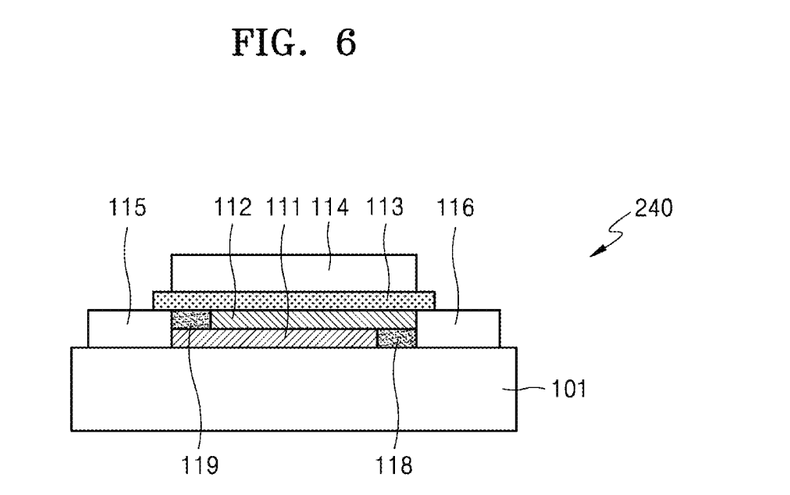
FIG. 6 is a cross-sectional view schematically illustrating a configuration of a field effect transistor according to some example embodiments.

In addition, FIG. 6 is a cross-sectional view schematically illustrating a configuration of a field effect transistor 240 according to some example embodiments. Referring to FIG. 6, in the field effect transistor 240, a gate insulating layer 113 may protrude in a lateral direction from a first edge of a second channel layer 112 toward a first source/drain electrode 115 such that the gate insulating layer 113 may further extend onto an upper surface of the first source/drain electrode 115. In addition, a gate electrode 114 on the gate insulating layer 113 may also protrude in the lateral direction from the first edge of the second channel layer 112 such that the gate electrode 114 may further extend above the upper surface of the first source/drain electrode 115. Then, the gate insulating layer 113 may completely cover an upper surface of the second channel layer 112. To this end, the height of the upper surface of the second source/drain electrode 116 may be the same as the height of the upper surface of the second channel layer 112.

In this case, an empty space may be between a lower surface of the gate insulating layer 113 and an upper surface of a first edge of a first channel layer 111. The field effect transistor 240 may further include a support layer 119 additionally disposed in the empty space between the lower surface of the gate insulating layer 113 and the upper surface of the first edge of the first channel layer 111. According to the present embodiment, areas of the first channel layer 111 and the second channel layer 112, to which an electric field is applied, may be further increased.

Figure 7:
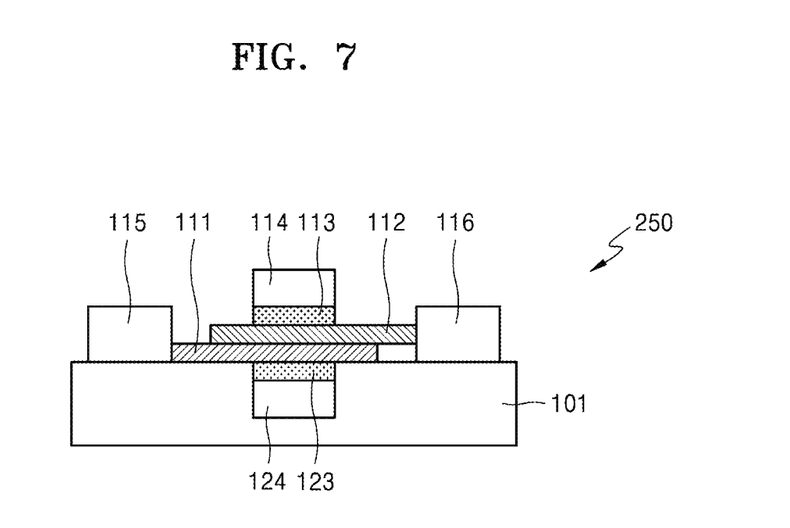
FIG. 7 is a cross-sectional view schematically illustrating a configuration of a field effect transistor according to some example embodiments.

FIG. 7 is a cross-sectional view schematically illustrating a configuration of a field effect transistor 250 according to some example embodiments. Referring to FIG. 7, the field effect transistor 250 may further include a lower gate insulating layer 123 embedded in a substrate 101 and disposed in contact with a lower surface of a first channel layer 111; and a lower gate electrode 124 embedded in the substrate 101 and disposed in contact with a lower surface of the lower gate insulating layer 123. The lower gate electrode 124 and the lower gate insulating layer 123 may be, for example, formed in a trench patterned in the substrate. Therefore, the field effect transistor 250 has a double gate structure including: a gate insulating layer 113 and a gate electrode 114 which are disposed above a second channel layer 112; and the lower gate insulating layer 123 and the lower gate electrode 124 which are disposed below the first channel layer 111.

The lower gate insulating layer 123 may include, for example, a general high-k dielectric material such as $SiO_2$, $SiN_x$, $HfO_2$, or $ZrO_2$. However, the lower gate insulating layer 123 is not limited thereto. Like the gate insulating layer 113 disposed on the second channel layer 112, the lower gate insulating layer 123 may also include an insulative, high-k, two-dimensional material to prevent charge trapping caused by dangling bonds.

The field effect transistor 250 shown in FIG. 7 may be turned on/off by adjusting voltages respectively applied to the lower gate electrode 124 below the first channel layer 111 and the gate electrode 114 above the second channel layer 112 to vary the energy band difference between the first channel layer 111 and the second channel layer 112. For example, the field effect transistor 250 may be turned on when the difference between the energy band of the first channel layer 111 and the energy band of the second channel layer 112 is large, and may be turned off when the difference between the energy band of the first channel layer 111 and the energy band of the second channel layer 112 is small. Because it is possible to individually apply voltages to the gate electrode 114 and the lower gate electrode 124 and individually adjust the energy band of the first channel layer 111 and the energy band of the second channel layer 112, the voltage range in which the field effect transistor 250 operates may be widened.

Because it is possible to individually adjust the energy band of the first channel layer 111 and the energy band of the second channel layer 112 through the voltage applied to the lower gate electrode 124 and the voltage applied to the gate electrode 114, the first channel layer 111 and the second channel layer 112 of the field effect transistor 250 having a double gate structure may include the same semiconductor material doped to have the same conductivity type. In this case, when the same voltage is applied to the lower gate electrode 124 and the gate electrode 114, the field effect transistor 250 is turned off, and when the difference between voltages applied to the lower gate electrode 124 and the gate electrode 114 is increased, the field effect transistor 250 is turned on.

Figure 8:
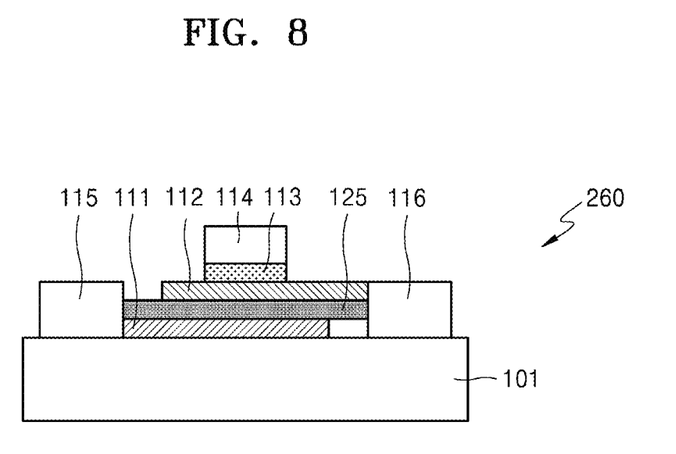
FIG. 8 is a cross-sectional view schematically illustrating a configuration of a field effect transistor according to some example embodiments.

FIG. 8 is a cross-sectional view schematically illustrating a configuration of a field effect transistor 260 according to another example embodiment. Referring to FIG. 8, the field effect transistor 260 may have a structure similar to the structure of the field effect transistor 200 shown in FIG. 1A and may further include an insulator layer 125 disposed between a first channel layer 111 and a second channel layer 112. The insulator layer 125 may be disposed to cover the entire upper surface of the first channel layer 111. In addition, the insulator layer 125 may protrude in a lateral direction from a second edge of the first channel layer 111 toward a second source/drain electrode 116. The second channel layer 112 may be disposed only on a portion of an upper surface of the insulator layer 125 such that the second channel layer 112 may not be in contact with a first source/drain electrode 115. Instead, the insulator layer 125 may be disposed only on a portion of the upper surface of the first channel layer 111 such that the insulator layer 125 may not be in contact with the first source/drain electrode 115. In addition, the second channel layer 112 may be disposed on the entire upper surface of the insulator layer 125.

The insulator layer 125 may provide an additional tunneling barrier between the first channel layer 111 and the second channel layer 112. When the insulator layer 125 is excessively thick, tunneling of charges may not occur, and thus, the thickness of the insulator layer 125 may be adjusted to be about 5 nm or less. For example, the thickness of the insulator layer 125 may range from about 1 nm to about 5 nm. Because charge tunneling is difficult to occur because of the insulator layer 125, when the field effect transistor 260 is in an OFF state, off-current flowing between the first source/drain electrode 115 and the second source/drain electrode 116 may be prevent and/or reduced. The insulator layer 125 shown in FIG. 8 may also be applied to the field effect transistors 200B, 210, 220, 230, 240, and 250 shown in FIG. 1B and FIGS. 3 to 7.

The aforementioned field effect transistors including a first channel layer, a second channel layer, and the gate insulating layer including an insulative, high-k, two-dimensional material on the second channel layer, according to some example embodiments, may be applied to various electronic devices including a switch and/or an amplifier, for example as part of processing circuitry and/or memory.

Figure 9:
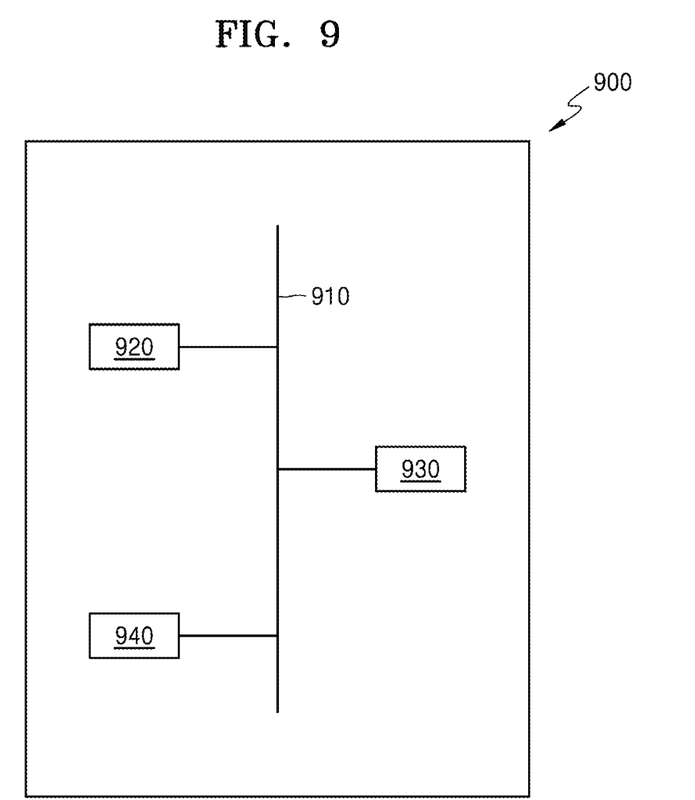
FIG. 9 shows a schematic of an electronic device that may include the aforementioned transistor including the gate insulating layer having a two-dimensional material according to some example embodiments.

FIG. 9 shows a schematic of an electronic device that may include the aforementioned transistor including the gate insulating layer having a two-dimensional material according to some example embodiments.

As shown, the electronic device 900 includes one or more electronic device components, including a processor (e.g., processing circuitry) 920 and a memory 930 that are communicatively coupled together via a bus 910.

The processing circuitry 920, may be included in, may include, and/or may be implemented by one or more instances of processing circuitry such as hardware including logic circuits, a hardware/software combination such as a processor executing software; or a combination thereof. For example, the processing circuitry 920 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 930 may include a non-transitory computer readable storage device, for example a solid state drive (SSD), storing a program of instructions, and the processing circuitry 920 may be configured to execute the program of instructions to implement the functionality of the electronic device 900.

In some example embodiments, the electronic device 900 may include one or more additional components 940, coupled to bus 910, which may include, for example, a power supply, a light sensor, a light-emitting device, any combination thereof, or the like. In some example embodiments, one or more of the processing circuitry 920, memory 930, or one or more additional components 940 may include any transistor including the gate insulating layer having a two-dimensional material according to any of the example embodiments described herein, such that the one or more of the processing circuitry 920, memory 930, and/or one or more additional components 940, and thus, the electronic device 900, may have a transistor with the gate insulating layer including the gate insulating layer having a two-dimensional material, thereby providing a transistor with increased operation speeds and low power consumption; and thus providing an electronic device 900 having improved electrical characteristics and thus improved performance and/or reliability.

While field effect transistors including a gate insulating layer having a two-dimensional material have been described according to embodiments with reference to the accompanying drawings, the field effect transistors described herein should be considered in a descriptive sense only, and it will be understood by those of ordinary skill in the art that various changes and equivalent other embodiments may be made therefrom. Therefore, the example embodiments described herein should be considered in a descriptive sense only and not for purposes of limitation. The scope of the present disclosure is defined not by the above description but by the following claims, and all differences within equivalent ranges of the scope of the present disclosure should be considered as being included in the scope of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A field effect transistor comprising:
a channel layer;
a gate insulating layer including an insulative, high-k, two-dimensional material on the channel layer;
a gate electrode on the gate insulating layer;
a first electrode electrically connected to the channel layer; and
a second electrode electrically connected to the channel layer,
wherein the channel layer comprises a semiconductor material having a two-dimensional crystal structure,
wherein the gate insulating layer comprises a ferroelectric material having a two-dimensional crystal structure,
wherein an interface charge density between the channel layer and the gate insulating layer is $1\times10^{12}$ per $cm^2$ or less,
wherein the field effect transistor has a subthreshold swing value of about 60 mV/dec or less.

2. The field effect transistor of claim 1, wherein the gate insulating layer comprises at least one of an oxide nanosheet having a two-dimensional crystal structure, and a layered perovskite having a two-dimensional crystal structure.

3. The field effect transistor of claim 2, wherein the gate insulating layer comprises the oxide nanosheet having the two-dimensional crystal structure, and the oxide nanosheet having the two-dimensional crystal structure comprises at least one of TiOx, TiNbOx, TiTaOx, NbOx, TaOx, LaNbOx, CaNbOx, SrNbOx, BaTaOx, WOx, and TiCoOx.

4. The field effect transistor of claim 2, wherein the gate insulating layer comprises the layered perovskite having the two-dimensional crystal structure, and the layered perovskite having the two-dimensional crystal structure comprises at least one of LaNb2O7, LaEuNb4O14, EuTa4O14, SrTa2O7, Bi2SrTa2O9, Ca2Nb3O10, La2Ti2NbO10, Ba5Ta4O15, and W2O7.

5. The field effect transistor of claim 2, wherein the gate insulating layer comprises the ferroelectric material having the two-dimensional crystal structure, and the ferroelectric material having the two-dimensional crystal structure comprises at least one of In2Se2, HfZrO2, and Si—HfO2.

6. The field effect transistor of claim 1, wherein the gate insulating layer including the insulative, high-k, two-dimensional material comprises at least one of 1T-HfO2, 1T-ZrO2, 1T-GeO2, 1T-SnO2, 1T-TiO2, 1T-PtO2, 2H—GeO2, 2H—HfO2, 1T-HfS2, 1T-PdO2, 2H—ZrO2, 1T-PtS2, 2H—MoO2, 2H—WO2, and 1T-SnS2.

7. The field effect transistor of claim 1, the channel layer comprises:
a first channel layer; and
a second channel layer on the first channel layer,
wherein the gate insulating layer is disposed on the second channel layer,
wherein the first electrode is electrically connected to the first channel layer, and
wherein the second electrode is electrically connected to the second channel layer.

8. The field effect transistor of claim 7, wherein
the second channel layer comprises the semiconductor material having the two-dimensional crystal structure,
the second channel layer and the gate insulating layer are van-der-Waals bonded to each other.

9. The field effect transistor of claim 7, wherein the first channel layer and the second channel layer comprise different semiconductor materials and are doped to have an electrically identical conductivity type.

10. The field effect transistor of claim 7, wherein the first channel layer is doped to have a first conductivity type, and the second channel layer is doped to have a second conductivity type which is electrically opposite to the first conductivity type, and
wherein the first channel layer and the second channel layer comprise an identical semiconductor material.

11. The field effect transistor of claim 7, wherein the gate insulating layer is disposed to cover a portion of an upper surface of the second channel layer.

12. The field effect transistor of claim 7, wherein the gate insulating layer and the gate electrode protrude in a lateral direction toward the first electrode from a first edge of the second channel layer such that the gate insulating layer and the gate electrode extend onto an upper surface of the first electrode.

13. The field effect transistor of claim 7, wherein the gate insulating layer and the gate electrode are disposed to protrude in a lateral direction toward the second electrode from a second edge of the second channel layer such that the gate insulating layer and the gate electrode extend onto an upper surface of the second electrode.

14. The field effect transistor of claim 7, further comprising an insulator layer disposed between the first channel layer and the second channel layer.

15. The field effect transistor of claim 7, further comprising:
a substrate which is insulative,
wherein the first channel layer is disposed on an upper surface of the substrate.

16. The field effect transistor of claim 15, wherein
the second channel layer covers a portion of an upper surface of the first channel layer,
a portion of the second channel layer protrudes in a lateral direction toward the second electrode from an edge of the first channel layer, and
the portion of the second channel layer protruding towards the second electrode is spaced apart from the substrate.

17. The field effect transistor of claim 15, wherein
the second channel layer covers a portion of an upper surface of the first channel layer,
a portion of the second channel layer protrudes in a lateral direction toward the second electrode from an edge of the first channel layer, and
the portion of the second channel layer protruding towards the second electrode contacts the upper surface of the substrate.

18. The field effect transistor of claim 15, further comprising:
a first contact layer on the substrate in direct contact with the first channel layer; and
a second contact layer on the substrate in direct contact with the second channel layer.

19. The field effect transistor of claim 18, wherein
the first electrode on the first contact layer, and
the second electrode on the second contact layer.

20. The field effect transistor of claim 15, further comprising:
a lower gate insulating layer embedded in the substrate and contacting with a lower surface of the first channel layer; and
a lower gate electrode embedded in the substrate and contacting with a lower surface of the lower gate insulating layer,
wherein the lower gate insulating layer comprises an insulative, high-k, two-dimensional material.

* * * * *